(12) United States Patent
Kim (10) Patent No.: US 7,010,009 B2
(45) Date of Patent: Mar. 7, 2006

(54) DISTRIBUTED BRAGG REFLECTOR LASER AND A METHOD OF MAKING SAME

(75) Inventor: Jong-Ryeol Kim, Suwon-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 236 days.

(21) Appl. No.: 10/371,049

(22) Filed: Feb. 20, 2003

(65) Prior Publication Data
US 2003/0169792 A1 Sep. 11, 2003

(30) Foreign Application Priority Data
Mar. 11, 2002 (KR) .................. 10-2002-0012957

(51) Int. Cl.
*H01S 3/10* (2006.01)
*H01S 5/00* (2006.01)
(52) U.S. Cl. ..................... 372/43; 372/29.02
(58) Field of Classification Search .......... 372/20, 372/46, 96
See application file for complete search history.

(56) References Cited

U.S. PATENT DOCUMENTS

| 4,847,857 A | * | 7/1989 | Ohkura ...................... 372/96 |
| 5,325,392 A | * | 6/1994 | Tohmori et al. .............. 372/96 |
| 5,340,637 A | * | 8/1994 | Okai et al. .................. 428/167 |
| 6,807,201 B1 | * | 10/2004 | Nitta ....................... 372/29.02 |

* cited by examiner

*Primary Examiner*—James Vannucci
(74) *Attorney, Agent, or Firm*—Cha & Reiter, L.L.C.

(57) ABSTRACT

Disclosed is a distributed Bragg reflector laser, which includes: an active layer; a first guide layer provided with a plurality of first gratings on an upper surface thereof and formed on one side of the active layer; and, a second guide layer provided with a plurality of second gratings on an upper surface thereof, wherein the second guide layer is formed on the other side of the active layer opposite to the first guide layer.

13 Claims, 9 Drawing Sheets

DISTRIBUTED BRAGG REFLECTOR LASER AND A METHOD OF MAKING SAME

CLAIM OF PRIORITY

This application claims priority to an application entitled "Distributed Bragg reflector laser", filed in the Korean Intellectual Property Office on Mar. 11, 2002 and assigned Serial No. 2002-12957, the contents of which are hereby incorporated by reference.

BACKGROUND OF THE INVENTION

1. Field of the Invention

The present invention relates generally to an optical communication system. More particularly, the present invention relates to a semiconductor laser provided for optical communication systems.

2. Description of the Related Art

In modern optical communication systems, wavelength division multiplexing (WDM) is used, in which a low-loss wavelength band is divided into a plurality of channels, multiplexed, and then simultaneously transmitted through an optical fiber.

The most typical examples of distributed Bragg reflector lasers (DBR lasers) are a sample grating distributed Bragg reflector laser and a super structure grating distributed Bragg reflector laser.

One example of the sample grating distributed Bragg reflector laser is disclosed in U.S. patent application Ser. No. 679,120 filed Jul. 12, 1996, U.S. Pat. No. 5,748,660 issued May 5, 1998 to Delorme et al., and entitled "Sample grating distributed Bragg reflector laser, very widely matchable by phase variation and process for using this laser." In this document is disclosed a semiconductor laser comprising an active section and two sample grating sections placed on both sides of the active section.

Further, one example of the super structure grating distributed Bragg reflector laser is disclosed in U.S. patent application Ser. No. 359,186, filed Dec. 19, 1994, U.S. Pat. No. 5,497,393 issued Mar. 5, 1996 to Kyu-Seok Lee et al., and entitled "Semiconductor laser with super structure grating distributed Bragg reflector." In this document is disclosed a semiconductor laser having several sampling periods. According to the embodiment, each of the sampling periods is provided with grating pitches of 233.5 nm, 235 nm, 236.5 nm, 238 nm and 239.5 nm, wherein the grating pitches are arranged corresponding to wavelengths of 25 periods (5837.5 nm), 5 periods (1175 nm), 25 periods (5912.5 nm), 5 periods (1195 nm) and 25 periods (5987.5 nm), respectively. Hereinafter, an effect generated from this structure will be referred to as a chirping effect.

However, the sample grating distributed Bragg reflector laser has a problem in that since it has a wide wavelength variable section but uses an electron beam lithography process, it is expensive to manufacture while having a low yield.

Alternatively, the super structure grating distributed Bragg reflector laser has a problem in that it has a narrow wavelength variable section in spite of a simple manufacturing process based upon a typical lithography process.

SUMMARY OF THE INVENTION

Accordingly, the present invention is to provide a distributed Bragg reflector laser having a wide wavelength variable section and capable of being manufactured more easily and cheaply.

In one embodiment of the present invention, there is provided a distributed Bragg reflector laser, including: an active layer; a first guide layer provided with a plurality of first gratings on an upper surface thereof and formed on one side of the active layer; and, a second guide layer provided with a plurality of second gratings on an upper surface thereof, wherein the second guide layer is formed on the other side of the active layer opposite to the first guide layer.

In another embodiment of the present invention, there is provided a method of making a distributed Bragg reflector laser, including the steps of: providing an active layer; providing first and second guide layers formed with a plurality of first and second gratings on the top surfaces thereof, first and second guide layers being formed on opposite sides of the active layer; providing first and second cladding layers, providing a first upper electrode laminated to a second cladding layer; providing a second upper electrode laminated to a second cladding layer; providing a third upper electrode laminated to a second cladding layer; and, providing a lower electrode disposed beneath a first cladding layer.

DETAILED DESCRIPTION OF THE PREFERRED EMBODIMENT

In accordance with the present invention, preferred embodiments of the present invention will be described in detail with reference to the attached drawings. In the drawings, the same element, although depicted in different drawings, will be designated by the same reference numeral or character. For the purposes of clarity and simplicity, a detailed description of known functions and configurations incorporated herein will be omitted as it may make the subject matter of the present invention unclear.

Figure 1:
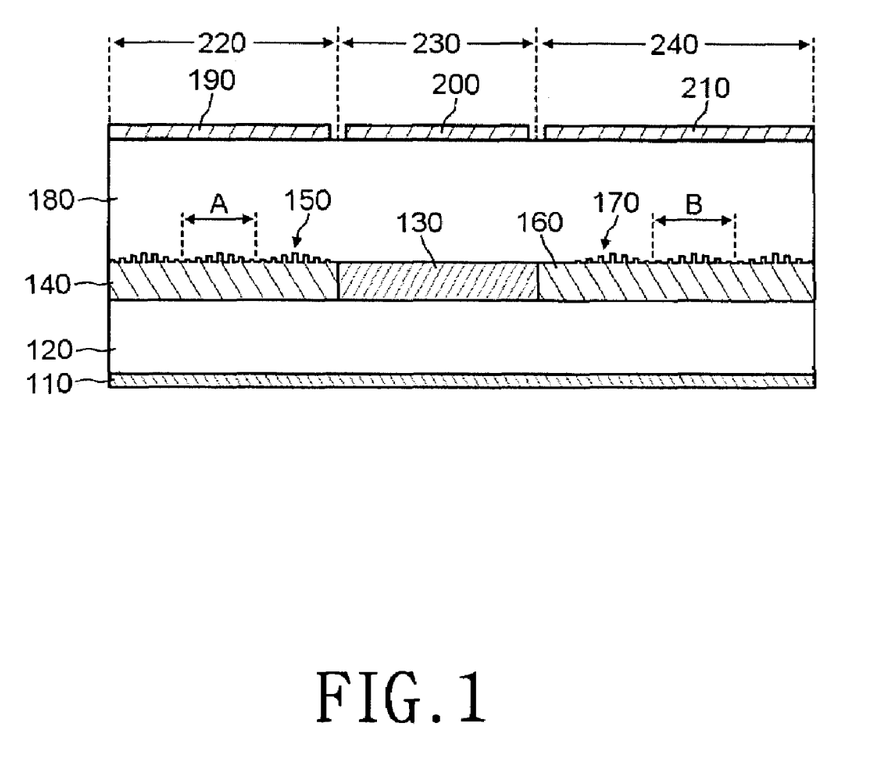
FIG. 1 is a cross-sectional view showing a construction of a distributed Bragg reflector laser according to one preferred embodiment of the present invention.
Figure 2:
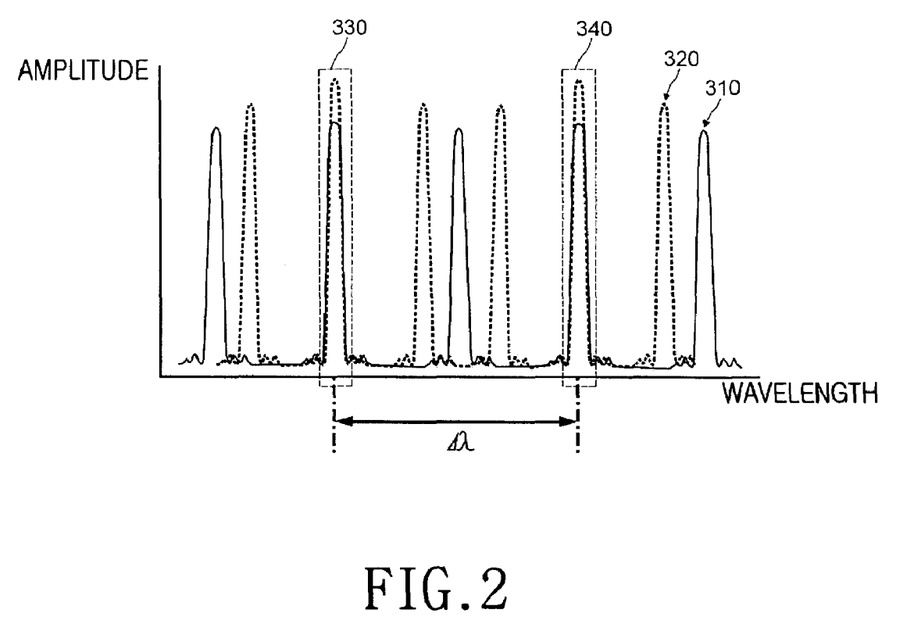
FIG. 2 is a diagram showing an output property of the distributed Bragg reflector laser shown in FIG. 1; and, FIGS. 3 to 9 show processes forming convex gratings according to the present invention.

FIG. 1 is a cross-sectional view showing a construction of a distributed Bragg reflector laser according to one preferred embodiment of the present invention. FIG. 2 is a diagram showing an output property of the distributed Bragg reflector laser shown in FIG. 1.

The distributed Bragg reflector laser generally comprises first and second grating sections 220 and 240, respectively, and an active section 230, and particularly first and second cladding layers 120 and 180, respectively, first and second guide layers 140 and 160, respectively, an active layer 130, first, second, and third upper electrodes, 190, 200, and 210, respectively, and a lower electrode 110.

The first cladding layer 120 is an N-type InP substrate, having a relatively low refractive index compared to those of the first and second guide layers 140 and 160, respectively. The lower electrode 110 is deposited underneath the first cladding layer 120.

The second cladding layer 180 is a P-type InP substrate, having a relatively low refractive index compared to those of the first and second guide layers 140 and 160, respectively.

The active layer 130 has a quantum wall structure, formed throughout the active section 230. When an electrical field is applied within the active section 230, electrons migrate from the first cladding layer 120 to the active layer 130, but holes migrate from the second cladding layer 180 to the active layer 130. These electrons and holes are recombined generating light within the active layer.

The first guide layer 140 is formed on one side of the active layer 130 and also throughout the first grating section 220, having a relatively high refractive index compared to those of the first and second cladding layers 120 and 180, respectively. An upper surface of the first guide layer 140 is provided with a plurality of first gratings 150, each of which are collected to take a convex shape within one pitch. Light incidented from the active layer 130 to the first guide layer 140 is subjected to filtering on a basis of a predetermined spectrum. That is to say, among the light incidented onto the first gratings 150 within the first guide layer 140, light within the predetermined spectrum is reflected by the first gratings 150 and thus confined in the first guide layer 140. Accordingly, light outside of the predetermined spectrum passes through the first gratings 150 and enters into the second cladding layer 180, thus incurring a loss of light.

The second guide layer 160 is formed at the other side of the active layer 130 opposite the first guide layer 140, having a relatively high refractive index compared to those of the first and second cladding layers 120 and 180, respectively, and formed throughout the second grating section 240. An upper surface of the second guide layer 160 is provided with a plurality of second gratings 170, each of which is collected to take a convex shape within one pitch. Light incidented from the active layer 130 to the second guide layer 160 is subjected to filtering on a basis of a predetermined spectrum. That is to say, among the light incidented onto the second gratings 170 within the second guide layer 160, light within the predetermined spectrum is reflected by the second gratings 170 and thus confined in the second guide layer 160. Accordingly, light out of the predetermined spectrum passes through the second gratings 170 and enters into the second cladding layer 180, thus incurring a loss of light.

The first upper electrode 190 is laminated on the second cladding layer 180 throughout the first grating section 220. An electrical field having a predetermined intensity is created between the first upper electrode 190 and the lower electrode 110 corresponding to an applied voltage.

The second upper electrode 200 is laminated on the second cladding layer 180 throughout the active section 230. An electrical field having a predetermined intensity is created between the second upper electrode 200 and the lower electrode 110 corresponding to an applied voltage.

The third upper electrode 210 is laminated on the second cladding layer 180 throughout the second grating section 240. An electrical field having a predetermined intensity is created between the third upper electrode 210 and the lower electrode 110 corresponding to an applied voltage.

The first, second, and third upper electrodes 190, 200, and 210, respectively, are spaced apart from one another to be electrically insulated.

As mentioned above, both of the first and second gratings 150 and 170, respectively, take a convex shape, thereby providing a chirping effect similar to an effect obtained from a structure in which gratings whose periods are different from each other are successively arranged along a given sampling section.

In addition, the first grating 150 can be made to have a pitch A different than a pitch B of the second grating 170, so as to get a vernier effect.

Referring to FIG. 2, when the pitch A of the first grating 150 is made to be different from the pitch B of the second grating 170, the first and second gratings 150 and 170, respectively, have output spectra 310 and 320, respectively, which are reflected from them and are slightly different from each other. Therefore, lights 330 and 340 (hereinafter, each referred to as a "channel") are output when the output spectra 310 and 320 reflected from the first and second gratings 150 and 170, respectively, are in phase with each other. Here, when a predetermined voltage is applied to the first and third upper electrodes 190 and 210, a wavelength interval $\Delta\lambda$ between the output channels 330 and 340 can be controlled. In this manner, channels 330 and 340 are output when the output spectra 310 and 320 reflected from the first and second gratings 150 and 170, respectively, are in phase with each other, which is called a vernier effect. This vernier effect is based on a principle in that, in a vernier caliper, a vernier scale is read at the point where a vernier line lines up with a main scale line, and then the main scale reading value is combined with the vernier scale reading value to get a final reading value.

FIGS. 3 to 9 show processes forming convex gratings according to the present invention.

Figure 3:
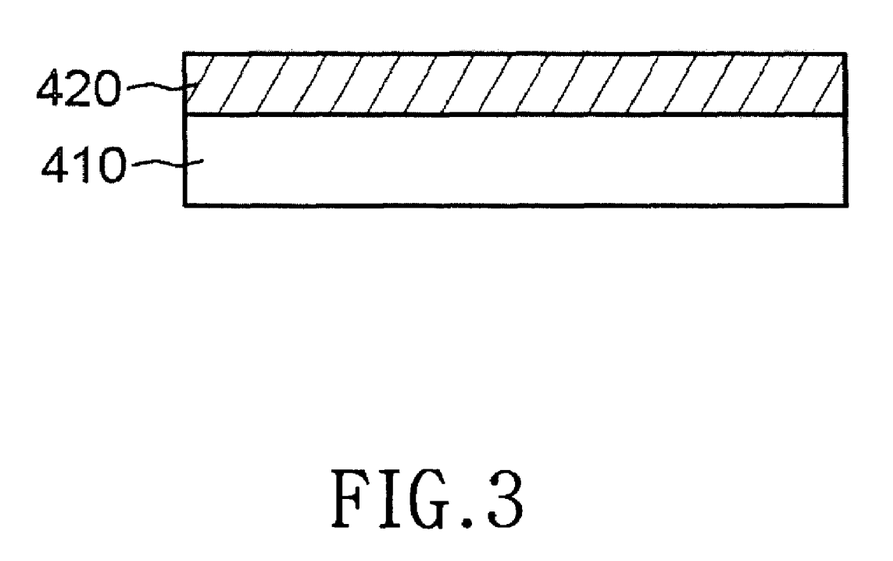

Referring to FIG. 3, a guide layer 420 is deposited on a lower cladding layer 410, wherein the guide layer 420 is designed to have a refractive index higher than that of the lower cladding layer 410.

Figure 4:
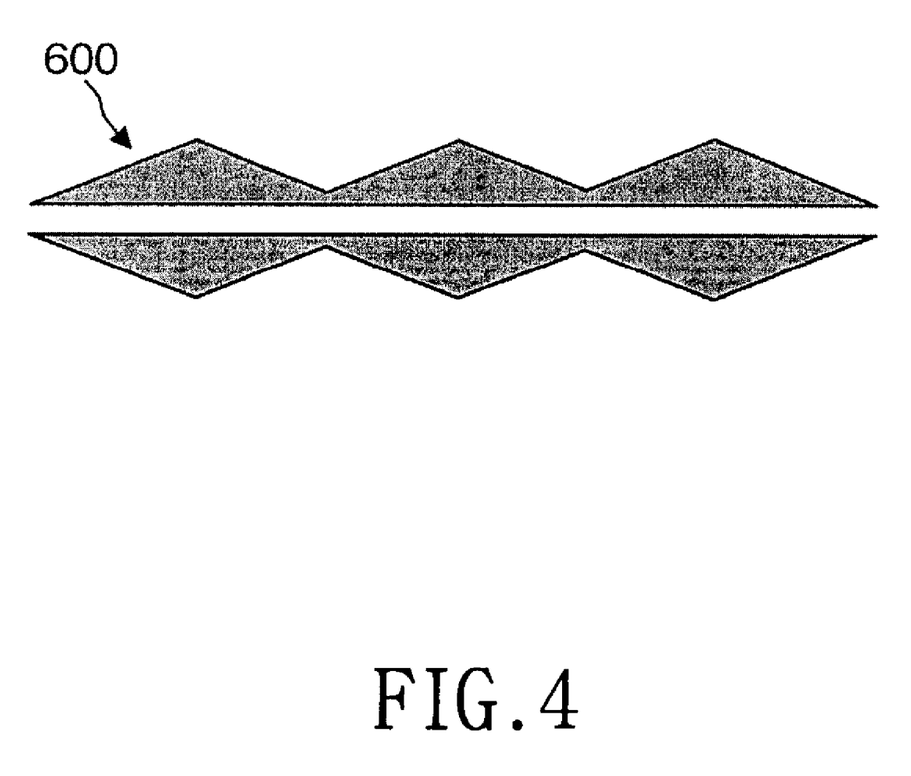
Figure 5:
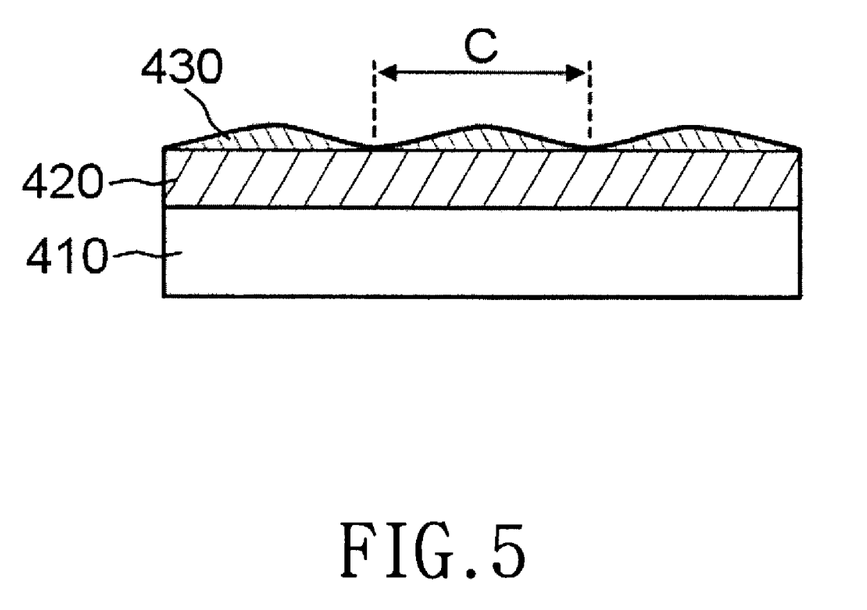

Now, referring to FIGS. 4 and 5, a selective area growth (SAG) layer 430 is formed using a mask 600 as shown in FIG. 4, where the SAG layer 430 has a thickness increasing and then decreasing within a given pitch C between one bottom and the corresponding next bottom. This process is called a SAG process. According to this SAG process, during growth following layer deposition, grain migration occurs more on the side on which the mask 600 has a wide width, but less on the side or edge on which the mask 600 has a narrow width. As a result of this, the SAG layer 430 is subjected to a periodical change in thickness corresponding to a given pitch, as shown in FIG. 5.

Figure 6:
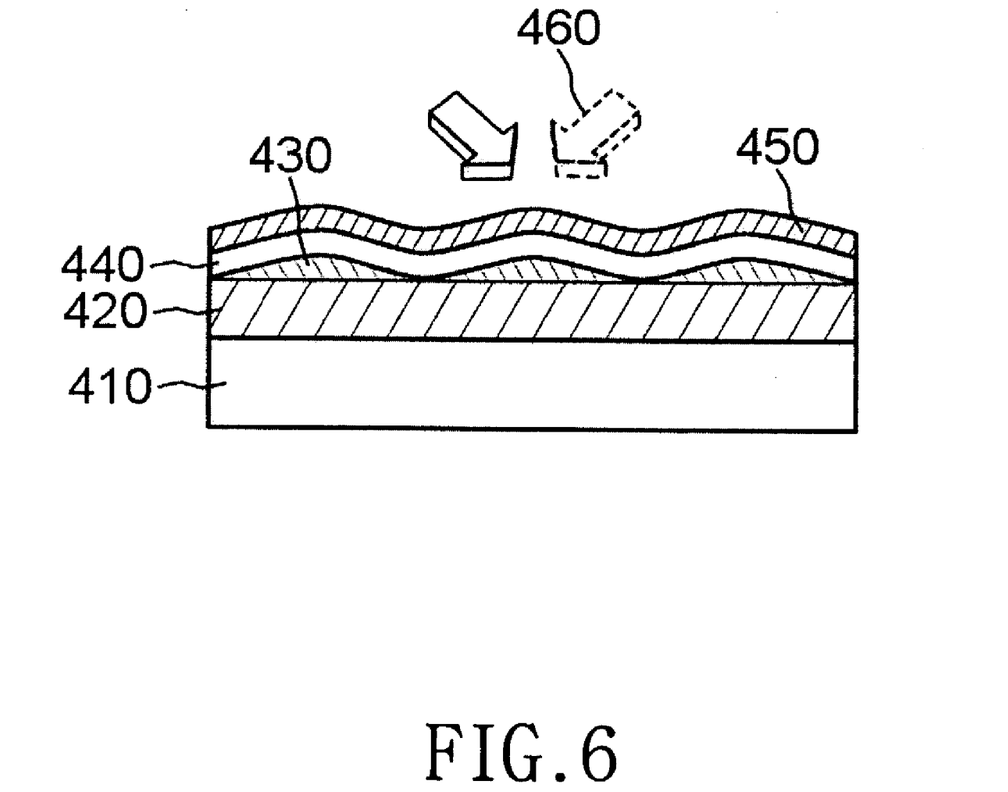

With reference to FIG. 6, upon the SAG layer 430 are deposited a dielectric layer 440 and a photoresist layer 450, in that order, and then an exposure using a holographic effect is performed. When an exposure using a holographic effect is performed, a grating pattern is formed on the photoresist layer 450, where the grating pattern is successively repeated with light and dark lines by interference between lights 460 incidented from two directions.

Figure 7:
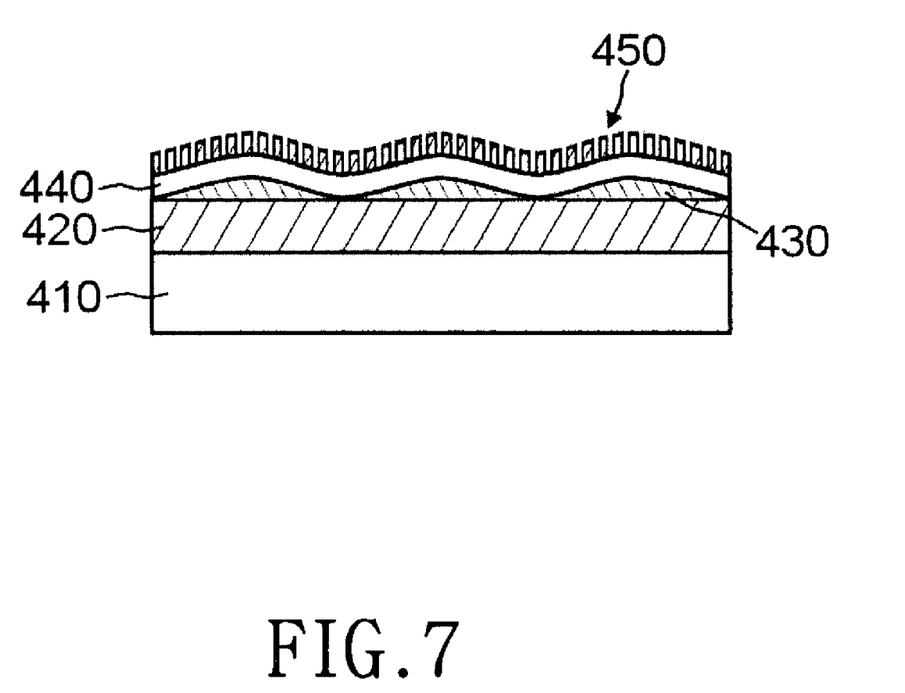

Referring to FIG. 7, upon performing a developing process after the exposing process, a part of the photoresist layer 450 which is subjected to a photosensitized reaction is eliminated, and thus the photoresist layer 450 takes a grating pattern.

Figure 8:
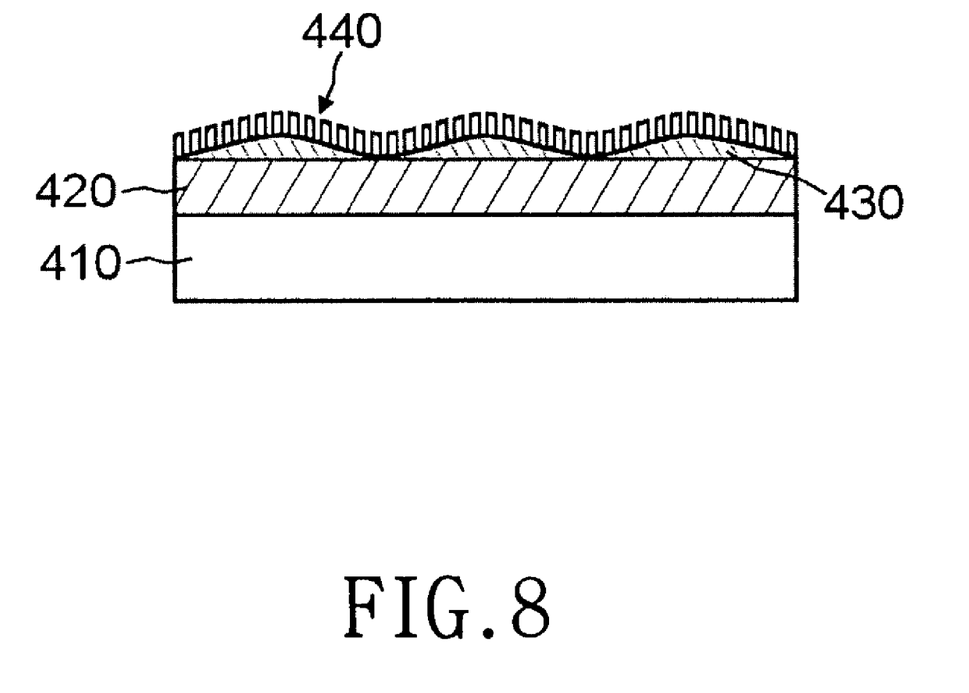

Referring to FIG. 8, an etching process is carried out using the grating patterned photoresist layer 450 until this photoresist layer 450 is eliminated. As a result of this etching, the dielectric layer 440 takes a grating pattern.

Figure 9:
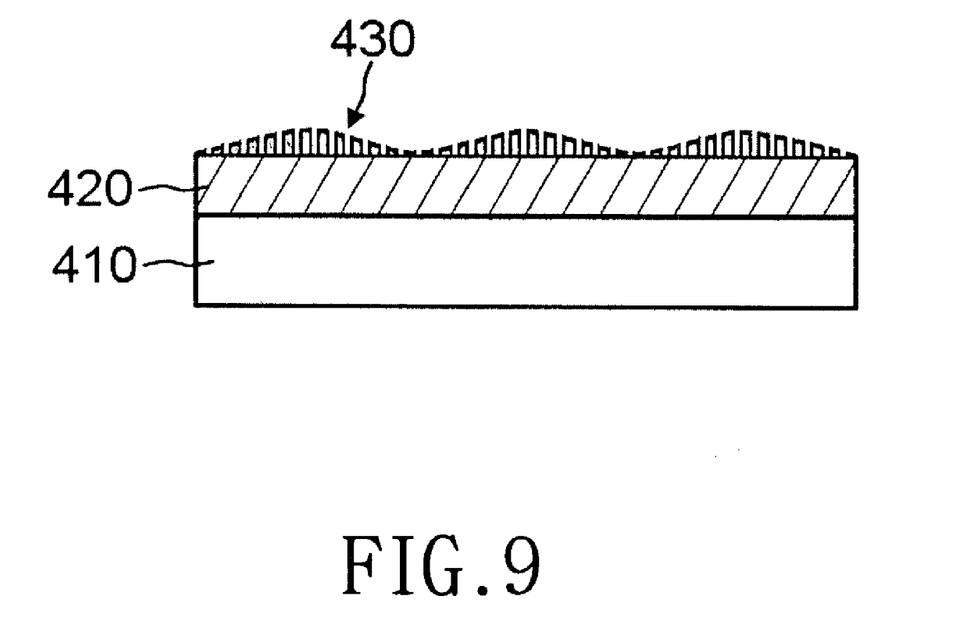

Referring to FIG. 9, another etching is carried out using the dielectric layer 450 as a mask, and thus the SAG layer 430 takes a grating pattern.

As seen from the foregoing, the distributed Bragg reflector laser according to the present invention can obtain the chirping effect only by a change in pattern of the sample grating. The advantage is that it is more easily and cheaply manufactured and also has a wide wavelength variable section.

While the invention has been shown and described with reference to a preferred embodiment thereof, it will be understood by those skilled in the art that various changes in form and details may be made therein without departing from the spirit and scope of the invention as defined by the appended claims. Therefore, this invention is not to be unduly limited to the embodiment set forth herein, but to be defined by the appended claims and equivalents thereof.

What is claimed is:

1. A distributed Bragg reflector laser, comprising:
   an active layer;
   a first guide layer formed on one side of the active layer;
   a plurality of first gratings disposed on, and protruding upwardly from, the first guide layer;
   a second guide layer formed on the other side of the active layer opposite to the first guide layer; and
   a plurality of second gratings disposed on, and protruding upwardly from, the second guide layer,
   wherein the first and second gratings have predetermined pitches such that the gratings within a pitch protrude upwardly with gradually changing height to collectively define an outer profile of convex shape.

2. The distributed Bragg reflector laser according to claim 1, wherein the first gratings of the first guide layer are formed with different pitches than those of the second gratings of the second guide layer.

3. The distributed Bragg reflector laser according to claim 1, further comprising: a lower electrode; a first cladding layer disposed on the lower electrode; a second cladding layer; and, a first, second, and third upper electrode disposed on the second cladding layer.

4. The distributed Bragg reflector laser according to claim 3, wherein the first cladding layer is an N-type InP substrate having a relatively low refractive index compared to those of the first and second guide layers.

5. The distributed Bragg reflector laser according to claim 3, wherein the second cladding layer is a P-type InP substrate having a relatively low refractive index compared to those of the first and second guide layers.

6. The distributed Bragg reflector laser according to claim 3, wherein the first upper electrode is laminated on the second cladding layer and a predetermined electrical field is created between the first upper electrode and the lower electrode according to an applied voltage.

7. The distributed Bragg reflector laser according to claim 3, wherein the second upper electrode is laminated on the second cladding layer and a predetermined electrical field is created between the second upper electrode and the lower electrode according to an applied voltage.

8. The distributed Bragg reflector laser according to claim 3, wherein the third upper electrode is laminated on the third cladding layer and a predetermined electrical field is created between the third upper electrode and the lower electrode according to an applied voltage.

9. The distributed Bragg reflector laser according to claim 1, wherein the active layer has a quantum wall structure.

10. A method of making a distributed Bragg reflector laser, the method comprising the steps of:
    providing an active layer;
    providing first and second guide layers formed on opposite sides of the active layer;
    providing a plurality of first gratings disposed on, and protruding upwardly from, the first guide layer;
    providing a plurality of second gratings disposed on, and protruding upwardly from, the second guide layer, the first and second gratings having predetermined pitches such that the gratings within a pitch protrude upwardly with gradually changing height to collectively define an outer profile of convex shape;
    providing first and second cladding layers,
    providing a first upper electrode laminated to a second cladding layer;
    providing a second upper electrode laminated to a second cladding layer;
    providing a third upper electrode laminated to a second cladding layer; and,
    providing a lower electrode disposed beneath a first cladding layer.

11. The method according to claim 10, wherein the step of forming the plurality of first and second gratings further includes the step of forming the pitches of the first grating to be different from the pitches of the second grating.

12. The method according to claim 10, wherein the step of providing the first cladding layer further includes the step of forming the first cladding layer from an N-type InP substrate having a relatively low refractive index compared to those of the first and second guide layers.

13. The method according to claim 10, wherein the step of providing the second cladding layer further includes the step of forming the second cladding layer from a P-type InP substrate having a relatively low refractive index compared to those of the first and second guide layers.

* * * * *